United States Patent
Furumiya et al.

[11] Patent Number: 5,804,843
[45] Date of Patent: Sep. 8, 1998

[54] SOLID STATE PICKUP DEVICE FOR SUPPRESSING SMEAR SIGNALS

[75] Inventors: Masayuki Furumiya; Yasuaki Hokari, both of Tokyo, Japan

[73] Assignee: NEC Corporation, Tokyo, Japan

[21] Appl. No.: 723,131

[22] Filed: Sep. 30, 1996

[30] Foreign Application Priority Data

Sep. 29, 1995 [JP] Japan .................................. 7-277172

[51] Int. Cl.⁶ ...................... H01L 27/148; H01L 29/768; H04N 9/64
[52] U.S. Cl. .......................... 257/222; 257/229; 257/225; 348/248; 348/249
[58] Field of Search .................................. 257/222, 221, 257/232, 229, 231, 215, 225, 238; 348/311, 316, 249, 248, 220, 322, 350, 353

[56] References Cited

U.S. PATENT DOCUMENTS

| | | | |
|---|---|---|---|
| 4,010,319 | 3/1977 | Levine | 348/249 |
| 4,567,524 | 1/1986 | Levine | 348/249 |
| 4,581,651 | 4/1986 | Miyata et al. | 348/249 |
| 4,608,608 | 8/1986 | Nishizawa et al. | 348/248 |
| 4,853,786 | 8/1989 | Yamawaki et al. | 348/248 |
| 4,951,148 | 8/1990 | Esser et al. | 257/229 |
| 5,276,341 | 1/1994 | Lee | 257/223 |

OTHER PUBLICATIONS

Morimoto et al., "A ⅔ –inch 2M–Pixel IT–CCD Image Sensor with Individual P–Wells for Separate V–CCD and H–CCD Formation", IEEE, ISSCC, TP 13.3, (1994) pp. 222,223 & 343.

*Primary Examiner*—Carl W. Whitehead
*Attorney, Agent, or Firm*—Foley & Lardner

[57] ABSTRACT

In a solid state image pickup device including a semiconductor substrate, a photo/electro conversion element and a register formed within the semiconductor substrate, and an photoshield layer having a slit-type aperture for limiting light incident to the photo/electro conversion element, an optical element is provided for the slit-type aperture, to thereby pass polarized light having an electric field polarization face polarized in the longitudinal direction of the slit-type aperture.

7 Claims, 7 Drawing Sheets

SOLID STATE PICKUP DEVICE FOR SUPPRESSING SMEAR SIGNALS

BACKGROUND OF THE INVENTION

1. Field of the Invention

The present invention relates to a solid state image pickup device, and more particularly, to an improvement of the sensitibity of the solid state image pickup device.

2. Description of the Related Art

As solid state image pickup devices, charge coupled device (CCD) type solid state image pickup devices are known. A prior art CCD type solid state image pickup device includes a semiconductor substrate, a photo/electro conversion element and a vertical CCD register formed within the semiconductor substrate and an photoshield layer having a slit-type aperture for limiting light incident to the photo/electro conversion element. This will be explained later in detail.

In the above-mentioned prior art solid state image pickup device, non-polalized light is incident via the slit-type aperture of the optical shield layer, onto the photo/electro conversion element. Therefore, when the solid state image pickup device is very fine, the slit-type aperture serves as a diffraction grating, so that light diffracted from the slit-type aperture penerates into other portions of the photo/electro conversion element of the semiconductor substrate, and charges generated thereform are introduced into the vertical CCD register. This may create noise, i.e., smear signals in the semiconductor substrate, while reducing the amount of light incident to the photo/electro conversion element, thus deteriorating the sensitivity.

SUMMARY OF THE INVENTION

It is an object of the present invention to suppress the generation of smear signals in a solid state pickup device to maintain the photosensitivity of the device.

According to the present invention, in a solid state image pickup device including a semiconductor substrate, a photo/electro conversion element and a register such as a vertical CCD register formed within the semiconductor substrate, and an photoshield layer having a slit-type aperture for limiting light incident to the photo/electro conversion element, an optical element is provided for the slit-type aperture, to thereby pass polarized light having an electric field polarization face polarized in the longitudinal direction of the slit-type aperture.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the preferred embodiments are described, a prior art solid state image pickup device will be explained with reference to FIGS. 1, 2A, 2B, 3A and 3B.

Figure 1:
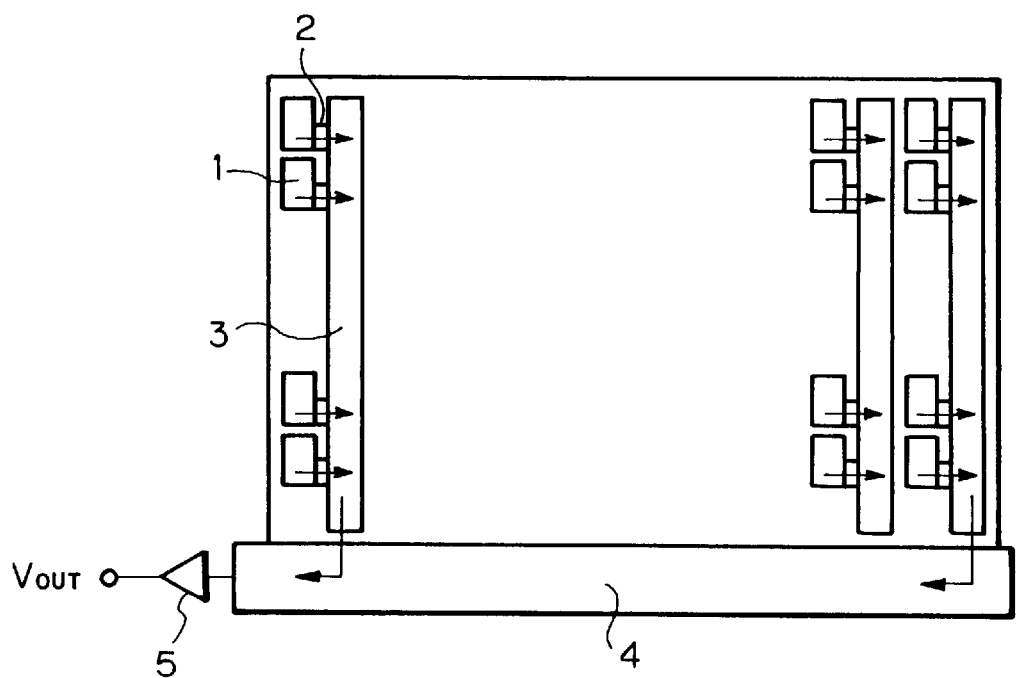
FIG. 1 is a plan view illustrating a prior art CCD type solid state pickup device.

In FIG. 1, which illustrates a prior art interline-transfer CCD type solid state image pickup device (see: M. Morimoto et al., "A ⅔ inch 2M-Pixel IT-CCD Image Sensor with Individual p-Wells for Separate V-CCD and H-CCD Formation", IEEE ISSCC TP13.3, pp. 222, 223 & 343, 1994), a ⅔-inch 2M-pixel unit having a size of 5 $\mu$m×5 $\mu$m is illustrated. That is, light is incident onto two-dimensionally arranged photo/electro conversion elements, i.e., photodiodes 1. As a result, signal charges obtained by the photodiodes 1 are transferred via transfer gates 2 to vertical CCD registers 3 arranged a vertical direction. Further, the signals charges are transferred from the vertical CCD registers 3 to a horizontal CCD register 4 arranged along a horizontal direction. Then, the signal charges are transferred within the horizontal CCD register 4 to an output portion 5 where an impedance transformation is performed upon the signal charges, thus generating an output voltage $V_{out}$.

Figure 2A:
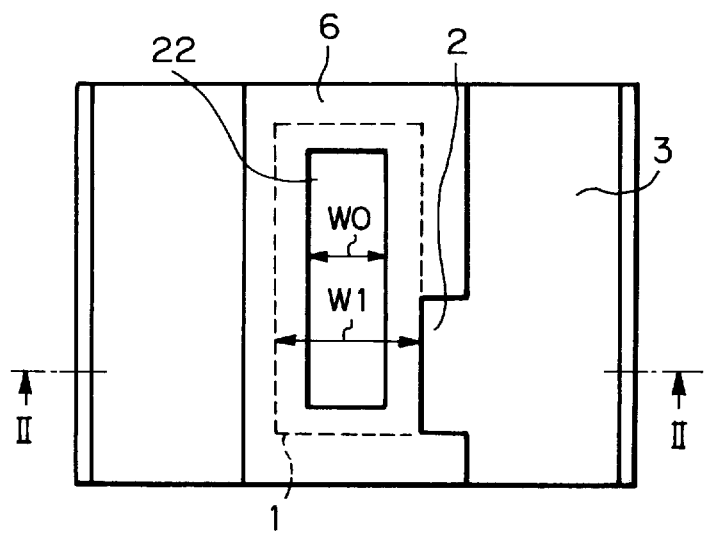
FIG. 2A is an enlarged plan view of the device of FIG. 1.
Figure 2B:
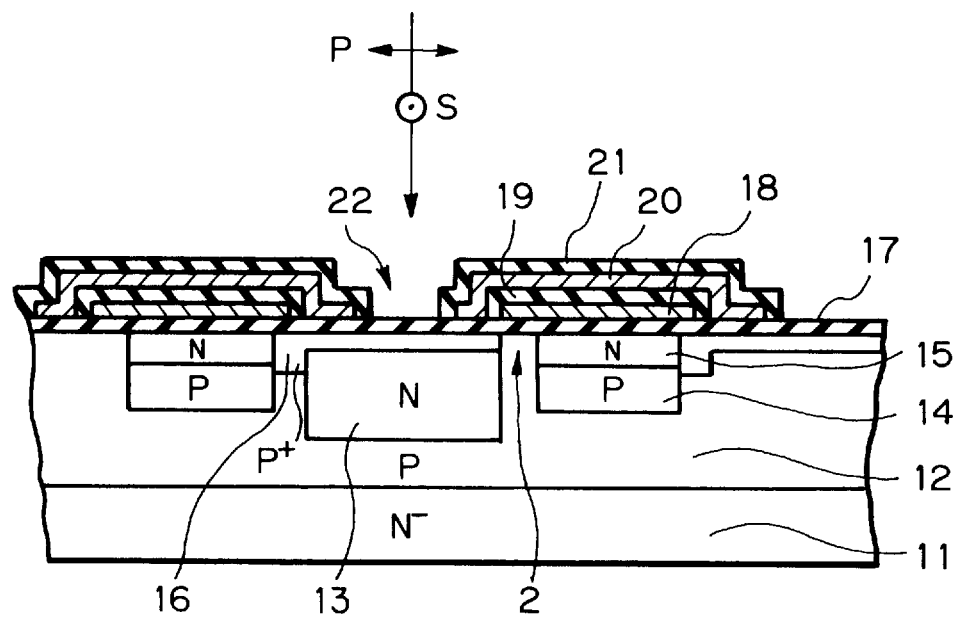
FIG. 2B is a cross-sectional view taken along the line II—II of FIG. 2A.

FIG. 2A is an enlarged plan view of one pixel of the device of FIG. 1, and FIG. 2B is a cross-sectional view taken along the line II—II of FIG. 2A. That is, a p-type well 12 is formed on an N⁻-type semiconductor substrate 11, and an N-type region 13 is formed within the P-type well 12. The P-type well 12 and the N-type region 13 form one of the photodiodes 1, so that a signal charge due to the photo/electro conversion is stored in the N-type region 13.

Also, a P-type region 14 and an N-type region 15 for the vertical CCD register 3 are formed within the P-type well 12, so that the signal charge stored from the photodiode 1 is read out to the N-type region 15. Then, the signal charge is transferred within the vertical CCD register 3.

Further, a P⁺-type region 16 serving as an element isolating region partly covers the N-type region 13. Therefore, a region between the N-type regions 13 and 15 where there is no P⁺-type region 16 is used for one of the transfer gates 2.

In addition, a gate insulating layer 17 is formed on the entire surface, and a transfer electrode 18 for the vertical CCD register electrode 18 is covered by an insulating layer 19, and a slit-type photoshield layer 20 made of metal is formed thereon. The shield layer 20 is covered by another insulating layer 21.

Thus, light is incident through a slit-type aperture 22 of the shield layer 20 onto the photodiode 1.

In FIGS. 1, 2A and 2B, an area of one pixel is about 5 $\mu$m×5 $\mu$m, for example, and the width W1 of the photodiode 1 is about 2 $\mu$m, for example. In this case, in order to prevent light from directly penetrating into the vertical CCD register 3, i.e., in order to suppress the generation of smear signals (spurious signals) within the vertical CCD register 3, the photoshield element 20 must cover a part of the photodiode 1. Therefore, the width W0 of the slit-type aperture 22 is about 1.0 to 1.5 μm. If the device is made smaller, the width W0 of the slit-type aperture 22 may be less than 1.0 μm.

Particularly, if the width W0 of the slit-type aperture 22 is equivalent to a wavelength from about 380 to 770 nm for visible light, the diffraction effect is not neglible, and accordingly, smear signals are remarkable increased. It is assumed that the incident light is non-polarized light, and is composed of an S-polarized light component whose electric field polarization face is polarized in the longitudinal direction of the slit-type aperture 22, i.e., vertically in FIG. 2B and a P-polarized light component whose electric field polarization face is polarized in the vertical direction of the slit-type aperture 22, i.e., horizontally in FIG. 2B. In this case, the intensity of the S-polarized light component is appoximately the same as that the P-polarized light component.

Figure 3A:
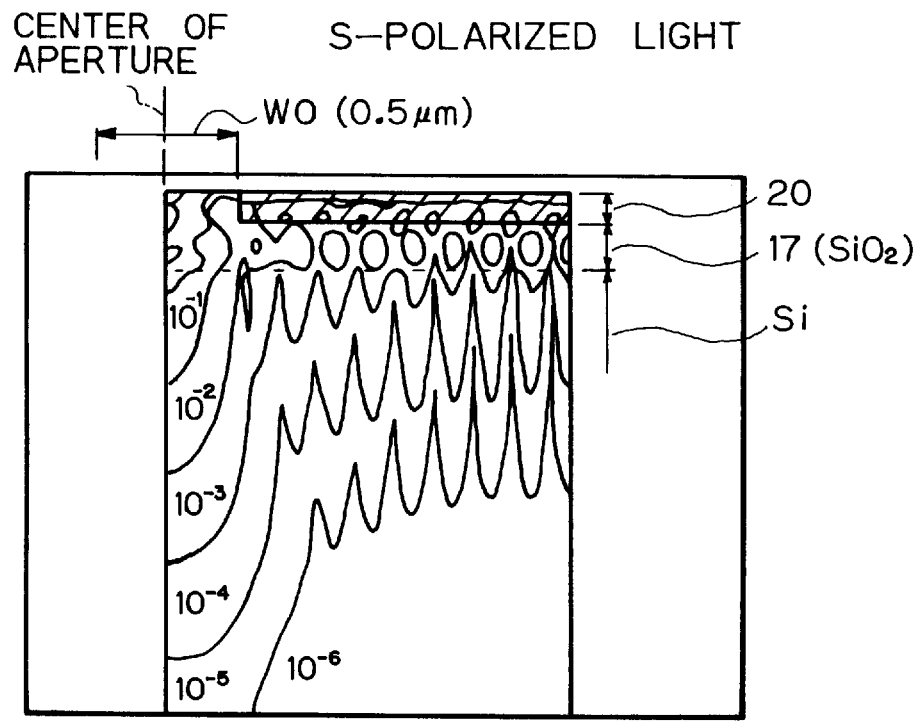
FIG. 3A is a simulation diagram of intensity of S-polarized light within the device of FIG. 2B.
Figure 3B:
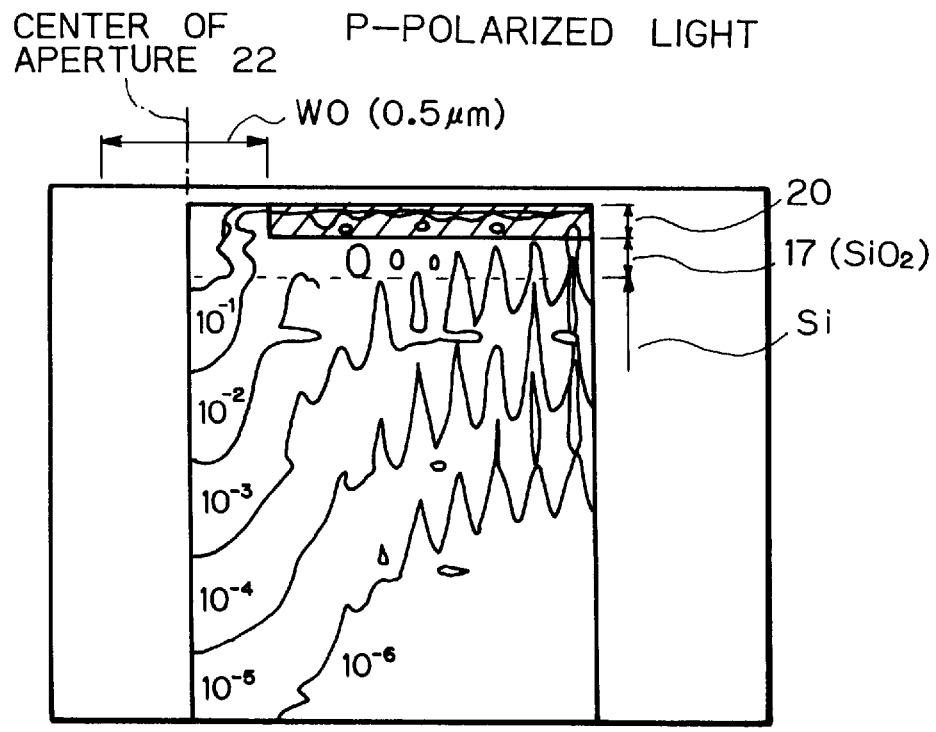
FIG. 3B is a simulation diagram of intensity of P-polarized light within the device of FIG. 2B.

The intensity of the S-polarized light component and the intensity of the P-polarized light component are simulated within the device of FIG. 2B, and the simulation results are obtained as shown in FIGS. 3A and 3B. That is, the intensity of each of the S-polarized light component and the P-polarized light component is larger beneath the slit-type aperture 22 than beneath the photoshield element 20. However, the intensity of the P-polarized light component beneath the photoshield element 20 is larger than that of the S-polarized light component beneath the photoshield element 20. This means the P-polarized light component rather than the S-polarized light component creates smear signals.

Figure 4:
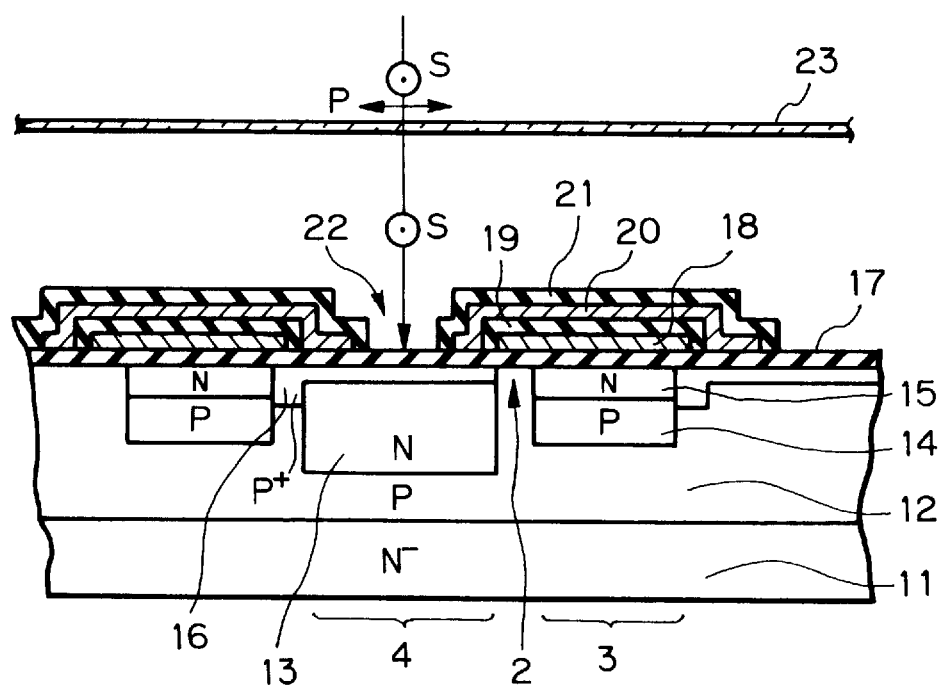
FIG. 4 is a cross-sectional view illustrating a first embodiment of the solid state pickup device according to the present invention.

In FIG. 4, which illustrates a first embodiment of the present invention, a polarization plate 23 is provided for the slit-type aperture 22. In this case, the polarization plate 23 is separated from the slit-type aperture 22.

The polarization plate 23 passes only polarized light having an electric field polarization face is polarized the longitudinal direction of the slit-type aperture 23. Therefore, when non-polarized light including an S-polarized light component and a P-polarized light component is incident onto the polarization plate 23, the polarization plate 23 passes only the S-polarizaed light component. Thus, only the S-polarized light component is incident via the slit-type aperture 22 onto the photodiode 4, to thereby reduce the smear signals. For example, if the width of the slit-type aperture 22 is 5 μm, about 5 dB of reduction of the smear signals can be obtained.

Figure 5:
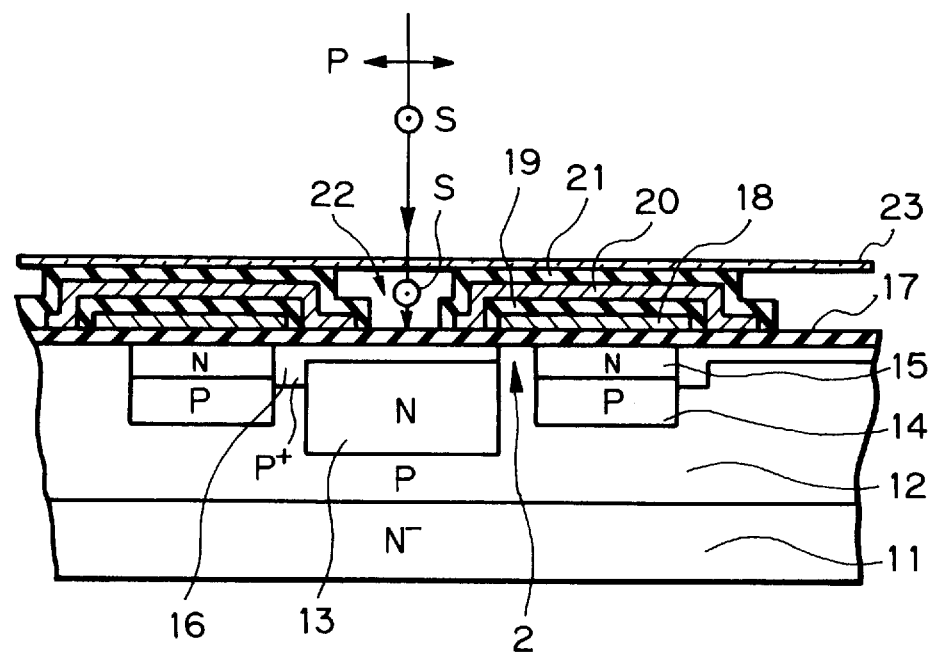
FIG. 5 is a cross-sectional view illustrating a modification of the deivce of FIG. 4.

In FIG. 5, a the polarization plate 23 is close to the slit-type aperture 22, i.e., in contact with the insulating layer 21. Also, in FIG. 5, only the S-polarized light component is incident via the slit-type aperture 22 to the photodiode 4, to thereby reduce the smear signals.

Figure 6:
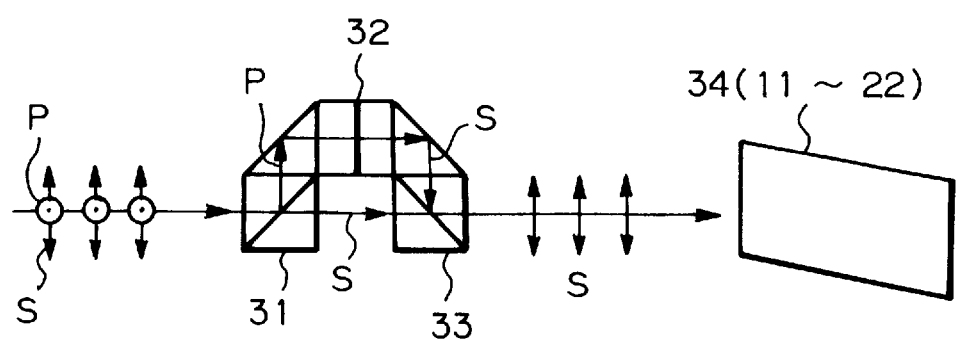
FIG. 6 is a diagram illustrating a second embodiment of the solid state image pickup device according to the present invention.

In FIG. 6, which illustrates a second embodiment of the present invention, a polarization beam splitter 31, a half wavelength plate 32 and a polarization beam combiner 33 are provided instead of the polarization plate 23 of FIG. 4. That is, the polarization beam splitter 31 splits non-polarized light into an S-polarized light component and a P-polarized light component. The S-polarized light component is incident via the polarization beam combiner 33 to a device 34 which is the same as that indicated by reference numerals 11 to 22 in FIG. 2B. On the other hand, the P-polarized light component from the polarization beam splitter 31 is incident onto the half wavelength plate 32 which changes the polarization direction of the P-polarized light component by 90 degrees. As a result, the P-polarized light component is converted by the half wavelength plate 32 into another S-polarized light component. Then, the two S-polarized light components are combined by the polarization beam combiner 33 into a combined S-polarized light component which is incident onto the device 34.

Thus, in the second embodiment as illustrated in FIG. 6, since use is made of the P-polarized light component, the sensitivity of the device can be improved by about 10 percent as compared with the first embodiment illustrated in FIGS. 4 and 5.

Figure 7:
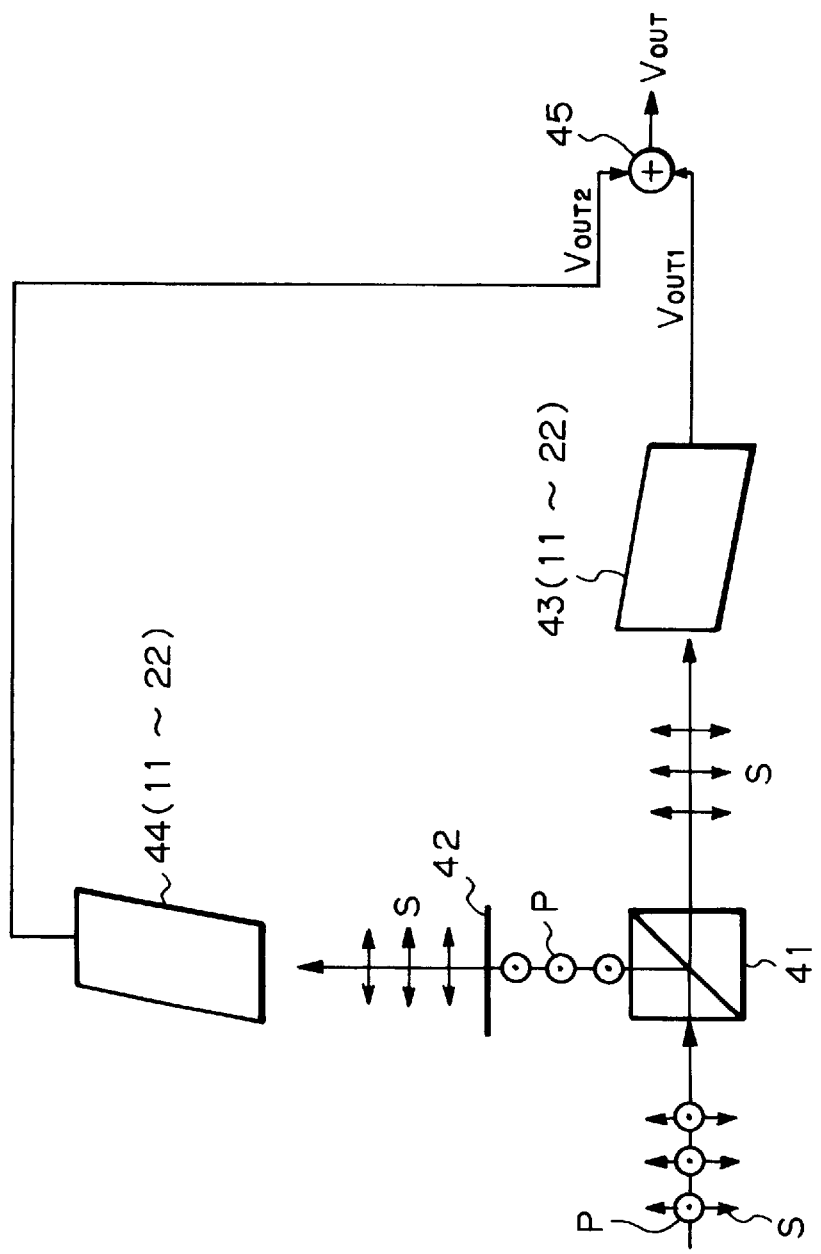
FIG. 7 is a diagram illustrating a third embodiment of the solid state image pickup device according to the present invention.

In FIG. 7, which illustrates a third embodiment of the present invention, a polarization beam splitter 41, a half wavelength plate 42 and a polarization beam combiner 33 are provided instead of the polarization plate 23 of FIG. 4. Also, devices 43 and 44, which are the same as that indicated by reference numerals 11 to 22 in FIG. 2B, and an adder 45 for combining output voltages $V_{out1}$ and $V_{out2}$ of the devices 43 and 44 are provided. That is, the polarization beam splitter 41 splits non-polarized light into a S-polarized light component and a P-polarized light component. The S-polarized light component is incident to the device 43. On the other hand, the P-polarized light component from the polarization beam splitter 41 is incident onto the half wavelength plate 42 which changes the polarization direction of the P-polarized light component by 90 degrees. As a result, the P-polarized light component is converted by the half wavelength plate 42 into another S-polarized light component. Then, this S-polarized light is incident onto the device 44. Then, the output voltage $V_{out1}$ of the device 43 and the output voltage $V_{out2}$ of the device 44 are combined by the adder 45 to generate an output voltage $V_{out}$.

Thus, in the third embodiment as illustrated in FIG. 7, since use is made of the P-polarized light component, the sensitivity of the device can be improved by about 10 percent as compared with the first embodiment as illustrated in FIGS. 4 and 5.

Figure 8:
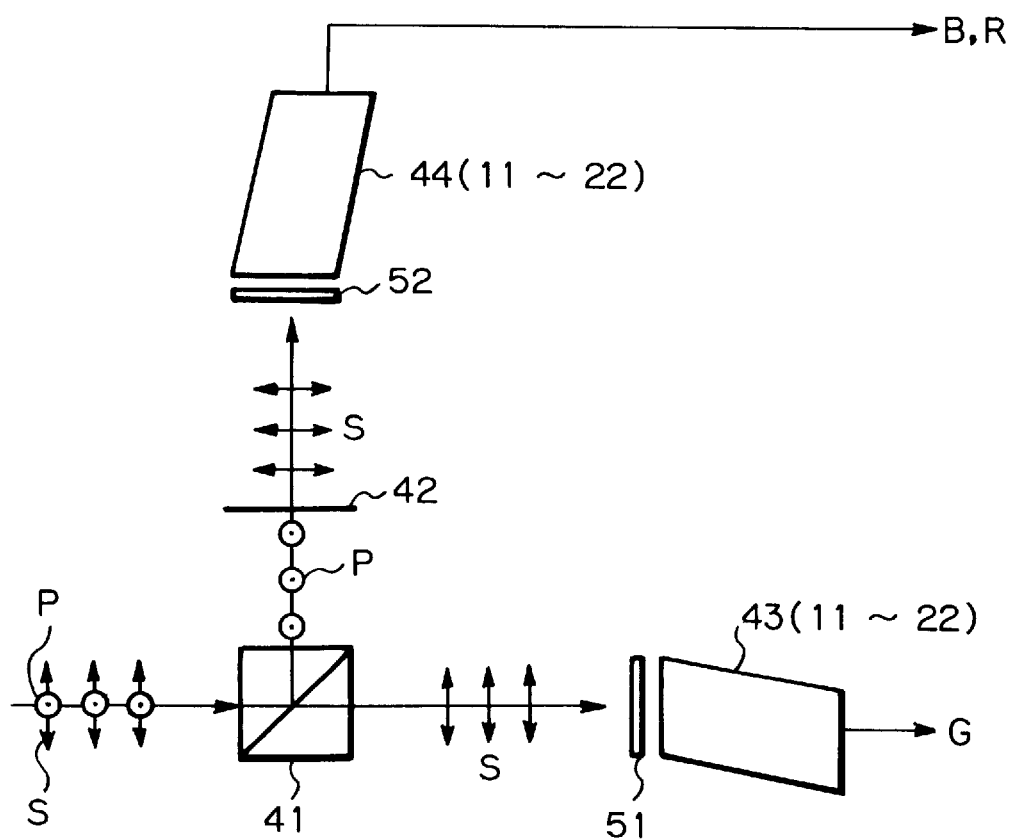
FIG. 8 is a diagram illustrating a fourth embodiment of the solid state image pickup device according to the present invention.

In FIG. 8, which illustrates a fourth embodiment of the present invention, in order to obtain a color picture, a green (G) color filter 51 is formed on the device 43 of FIG. 7, and a blue (B)/red (R) color filter 52 is formed on the device 44 of FIG. 7. In this case, the adder 45 of FIG. 7 is not provided. Note that the arrangement of color elements of the filter 51 is different from that of color elements of the filter 52.

Thus, also in the fourth embodiment as illustrated in FIG. 8, since use is made of the P-polarized light component, the sensitivity of the device can be improved.

As explained hereinabove, according to the present invention, since only polarized light polarized in the longitudinal direction of a slit-type aperture of an photoshield element is incident onto a photo/electro conversion element, smear signals can be reduced to reduce noise. Also, the sensitivity can be improved.

We claim:

1. A solid state image pickup device comprising:

a semiconductor substrate;

a photo/electro conversion element formed within said semiconductor substrate;

a register formed within said semiconductor substrate;

an photoshield layer formed on said semiconductor substrate, said photoshield layer having a slit-type aperture for limiting light incident to said photo/electro conversion element; and optical means, provided for said slit-type aperture, for passing polarized light having an electric field polarization face polarized in a longitudinal direction of said slit-type aperture.

2. The device as set forth in claim 1, wherein said optical means comprises a polarization plate.

3. The device as set forth in claim 1, wherein said optical means is separated from said slit-type aperture.

4. The device as set forth in claim 1, wherein said optical means is close to said slit-type aperture.

5. The device as set forth in claim 1, wherein said optical means comprises:

a polarization beam splitter for splitting non-polarized light into first and second polarized light components;

a half wavelength for changing an electric field polarization face of said second polarized light component by 90 degrees to generate a third polarized light component; and a polarization beam combiner for combining said first polarized light component with said third polarized light component.

6. A solid state image pickup device comprising:

first and second semiconductor substrates;

first and second photo/electro conversion elements formed within said first and second semiconductor substrates, respectively;

first and second photoshield layers formed on said first and second semiconductor substrates, respectively, each of said photoshield layers having first and second slit-type apertures, respectively, for limiting light incident to said first and second photo/electro conversion elements;

a polarization beam splitter for splitting non-polarized light into a first polarized light component having an electric field polarization face polarized in a longitudinal direction of said first slit-type aperture and a second polarized light component having an electric field polarization face polarized in a direction perpendicular to a longitudunal direction of said second split-type aperture; and a half wavelength for changing an electric field polarization face of said second polarized light component by 90 degrees to generate a third polarized light component;

said first polarized light component being incident via said first split-type aperture of said first photo/electro conversion element, said second polarized light component being incident via said second split-type aperture of said second photo/electro conversion element.

7. The device as set forth in claim 6, further comprising:

a first filter having a first color characteristic, interposed between said polarization beam splitter and said first photo/electro conversion element; and a second filter having a second color characteristic different from said first color characteristic, interposed between said polarization beam splitter and said first photo/electro conversion element.

* * * * *